(12) United States Patent
Ormond et al.

(10) Patent No.: US 7,529,449 B2
(45) Date of Patent: May 5, 2009

(54) SUBSTRATE, DEVICE AND METHOD FOR FORMING A GUIDANCE STRUCTURE IN THE SUBSTRATE, AND POSITIONING METHOD

(75) Inventors: Brian Ormond, Kanagawa (JP); Masaki Kobayashi, Kanagawa (JP); Toshimichi Iwamori, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 121 days.

(21) Appl. No.: 11/210,685

(22) Filed: Aug. 25, 2005

(65) Prior Publication Data

US 2006/0204167 A1 Sep. 14, 2006

(30) Foreign Application Priority Data

Mar. 14, 2005 (JP) ............................. 2005-071938

(51) Int. Cl.
  *G02B 6/26* (2006.01)
  *G02B 6/42* (2006.01)
  *G02B 6/12* (2006.01)
(52) U.S. Cl. .......................................... 385/52; 385/14
(58) Field of Classification Search ................... 385/14, 385/52

See application file for complete search history.

(56) References Cited

U.S. PATENT DOCUMENTS

| 6,982,564 | B2 * | 1/2006 | Akram et al. | 324/754 |
| 2004/0188824 | A1 * | 9/2004 | Akram et al. | 257/698 |
| 2006/0012967 | A1 * | 1/2006 | Asai et al. | 361/764 |

FOREIGN PATENT DOCUMENTS

JP 09-219583 8/1997

* cited by examiner

*Primary Examiner*—Kevin S Wood
(74) *Attorney, Agent, or Firm*—Morgan, Lewis & Bockius LLP

(57) ABSTRACT

A substrate is bonded to a semiconductor integrated circuit to which plural solder bumps have been adhered. The substrate includes: plural contact portions that are disposed at positions corresponding to the positions of the plural solder bumps and include contact surfaces which contact the solder bumps; and a guidance structure that is disposed in the contact surfaces and, when the solder bumps are melted, guides the melted solder bumps to predetermined regions within the contact surfaces. The predetermined regions are set so that the semiconductor integrated circuit and the substrate are properly aligned.

7 Claims, 21 Drawing Sheets

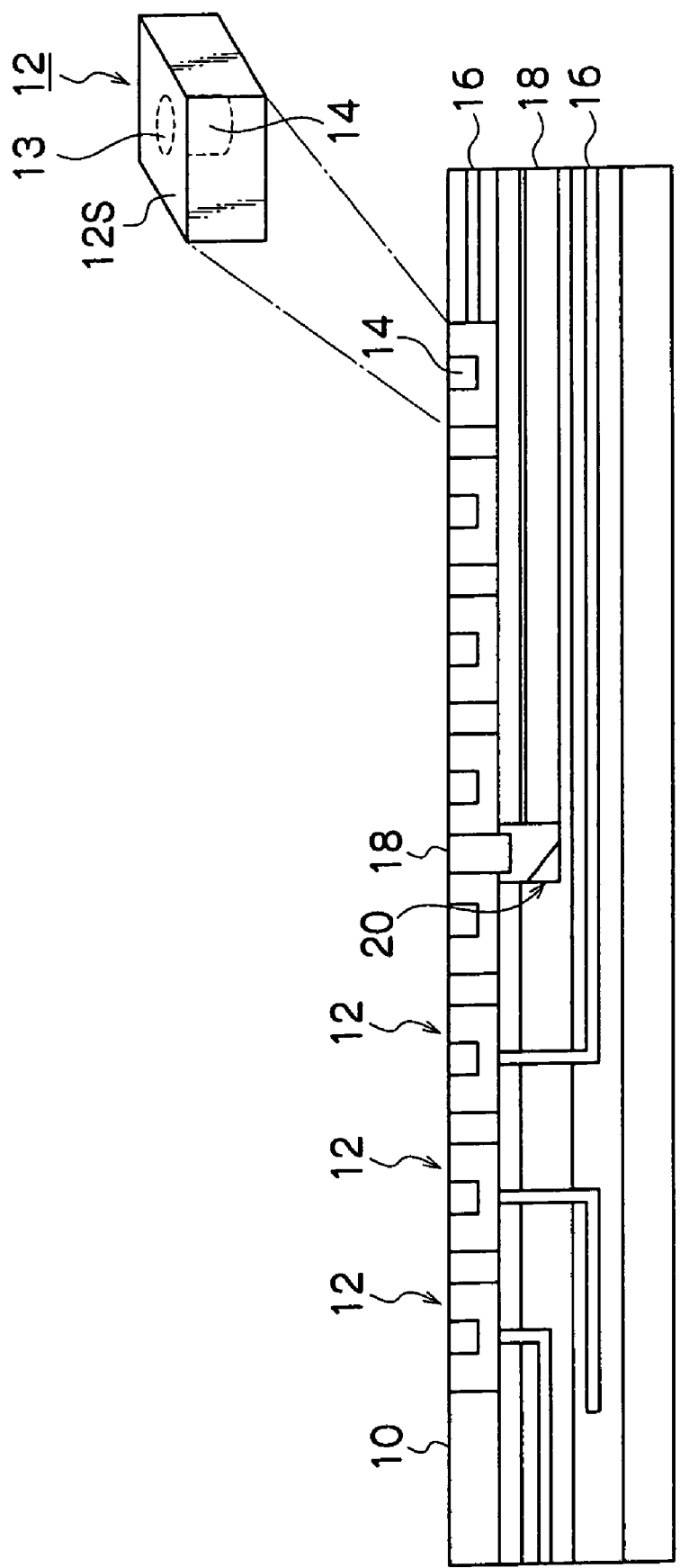

SUBSTRATE, DEVICE AND METHOD FOR FORMING A GUIDANCE STRUCTURE IN THE SUBSTRATE, AND POSITIONING METHOD

CROSS-REFERENCE TO RELATED APPLICATION

This application claims priority under 35 USC 119 from Japanese Patent Application No. 2005-071938, the disclosure of which is incorporated by reference herein.

BACKGROUND OF THE INVENTION

1. Field of the Invention

The present invention relates to a substrate, a device and method for forming a guidance structure in the substrate, and a positioning method, and in particular to a substrate that is bonded to a semiconductor integrated circuit to which plural solder bumps have been adhered, and a method of positioning the substrate and the semiconductor integrated circuit.

2. Description of the Related Art

Conventionally, plural semiconductor integrated circuits disposed with optical communication elements have been bonded to a substrate in which an optical waveguide used for the optical communication is formed, and optical communication has been conducted via the optical waveguide between the optical communication elements of the plural semiconductor integrated circuits bonded to the substrate.

In order to conduct optical communication via the optical waveguide between the optical communication elements of the plural semiconductor integrated circuits in this manner, it is necessary to accurately mount the optical communication elements of the semiconductor integrated circuits at a position at the end of the optical waveguide of the substrate.

Conventionally, an invention has been proposed where pads of a printed substrate are formed in partially standing bumps, mounting parts to which solder bumps have been adhered are placed on the printed substrate so that the solder bumps are positioned on the pads, the mounting parts and the printed substrate are photographed with an X-ray transmittance device by transmitting X-rays through the mounting parts and the printed substrate, and the connection status of the solder is determined on the basis of the shape of the transmittance image (e.g., see Japanese Patent Application Laid-Open Publication (JP-A) No. 09-219583).

However, the above-described invention determines the connection status of the solder rather than accurately positioning the mounting parts and the printed substrate. Thus, when it is determined that the connection status of the solder is not accurate, the invention cannot respond to this.

SUMMARY OF THE INVENTION

The present invention has been made in view of this fact.

An aspect of the invention provides a substrate that is bonded to a semiconductor integrated circuit to which a plurality of solder bumps has been adhered, the substrate including: a plurality of contact portions, each of which is disposed at a position corresponding to the position of each of the plurality of solder bumps and includes a contact surface which contacts the corresponding solder bump; and a guidance structure that is disposed in the contact surface and, when the solder bump is melted, guides the melted solder bump to a predetermined region within the contact surface, wherein the predetermined region is set so that the semiconductor integrated circuit and the substrate are accurately aligned.

BRIEF DESCRIPTION OF THE DRAWINGS

Embodiments of the present invention will be described in detail based on the following figures, wherein:

FIG. 1 is a cross-sectional view of a substrate relating to an embodiment of the present invention;

DETAILED DESCRIPTION OF THE INVENTION

Figure 2B:
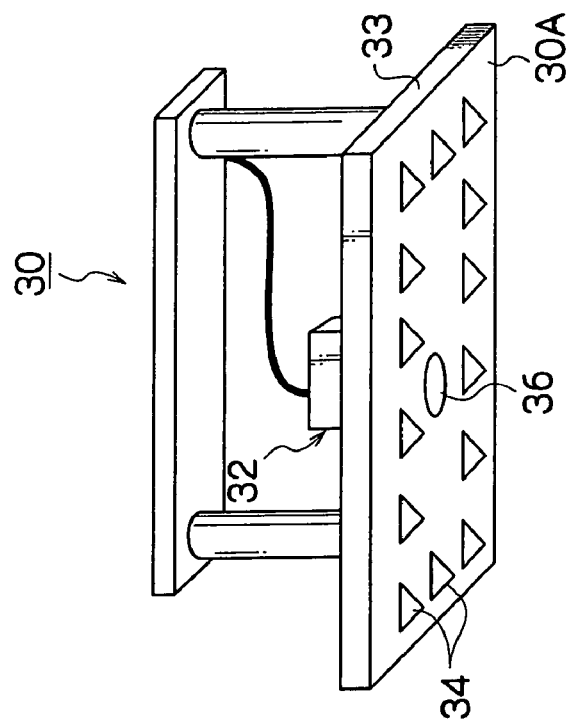
FIGS. 2A and 2B are diagrams showing a guidance structure forming device according to the embodiment of the present invention, with FIG. 2A being a cross-sectional view and FIG. 2B being a perspective view.

An embodiment of the invention will be described in detail below with reference to the drawings.

As shown in FIG. 1, a substrate 10 that is bonded to a later-described semiconductor integrated circuit 50 is disposed with plural contact portions (bonding pads) 12. The contact portions 12 include contact surfaces 12S that have a guidance structure which, when solder bumps 54 adhered to the semiconductor integrated circuit 50 are melted, guides the melted solder bumps to predetermined regions within the contact surfaces 12S. In the present embodiment, holes 14 are formed as the guidance structure.

The substrate 10 is disposed with an optical waveguide 18 that aids later-described optical communication. A mirror 20 is disposed in the optical waveguide 18, and the mirror 20 is curved inside the substrate 10. The substrate 10 is also disposed with wiring 16 that is connected to the contact portions 12.

Figure 2A:
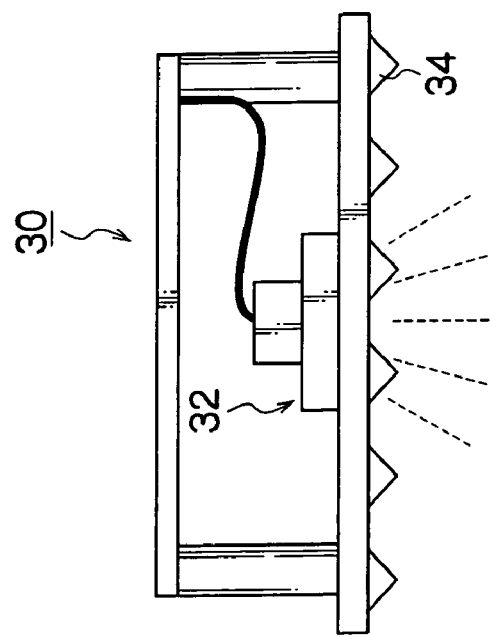

FIGS. 2A and 2B show a guidance structure forming device 30 that forms the guidance structure in the contact portions 12 of the substrate 10. The guidance structure forming device 30 includes a support substrate 33 in which an opening 36 is formed, a camera 32 serving as photographing unit that photographs via the opening 36, and plural protrusions 34 serving as later-described guidance structure forming unit disposed on a surface 30A of the support substrate 33 opposite from the camera 32.

Next, the disposed positions of the protrusions 34 of the guidance structure forming device 30 will be described with reference to FIGS. 3A and 3B and FIG. 4.

Figure 4:
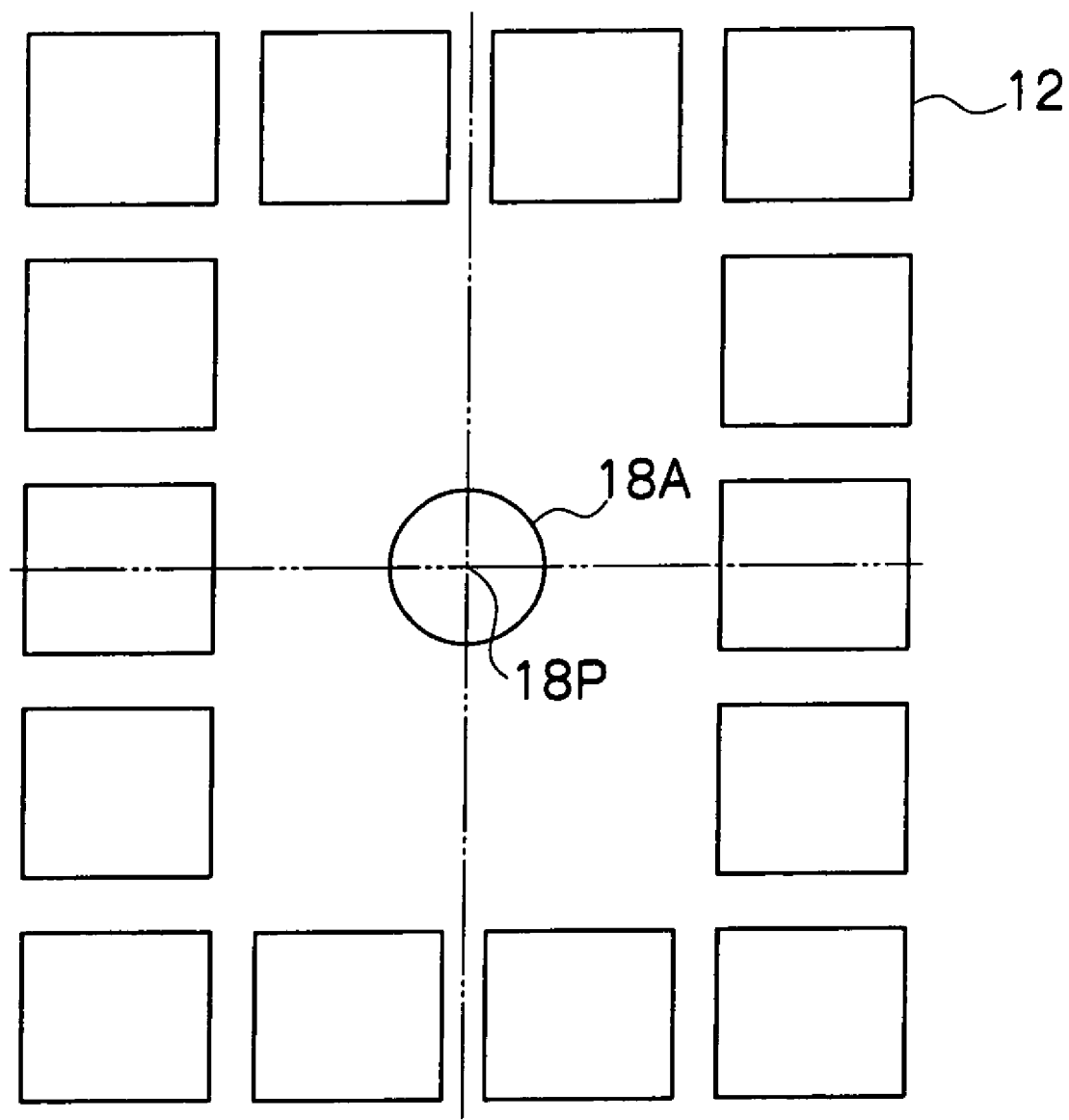
FIG. 4 is a diagram showing the positional relationship between contact portions and an optical waveguide.

In order to simplify description, an example will be described where, although slightly different from that which is shown in FIG. 1, the substrate 10 includes two rows of five contact portions 12, which are arranged at equidistant intervals, that are separated by a predetermined distance around an end 18A of a surface of the optical waveguide 18 at the semiconductor integrated circuit side, with two contact portions 12 being disposed at equidistant intervals between the contact portions 12 which position at the upper and lower ends of the rows, as shown in FIG. 4.

Figure 3A:
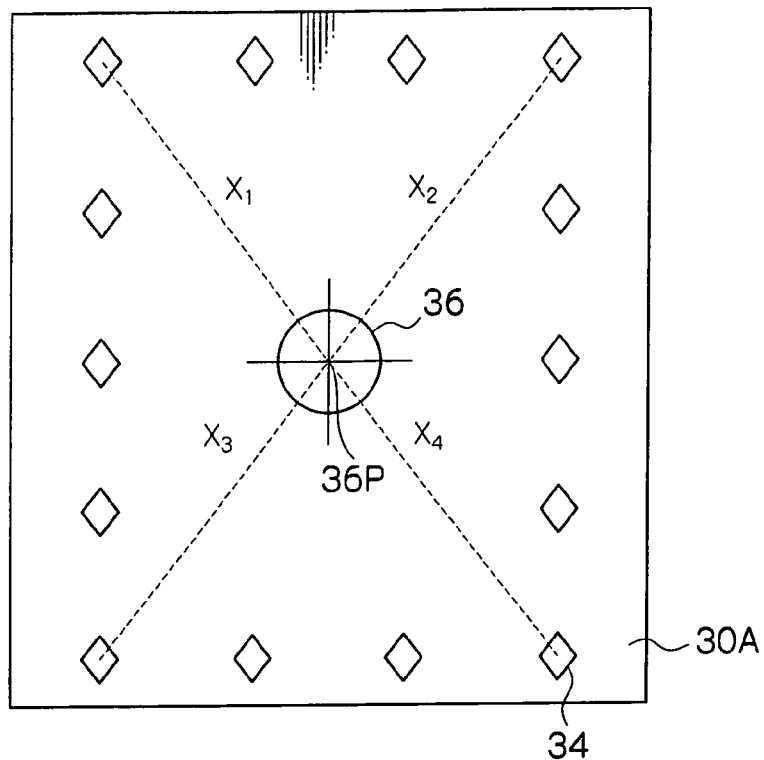
FIG. 3A is a diagram showing the disposed positions of protrusions formed on a surface of the guidance structure forming device.

FIG. 3A shows the surface 30A of the guidance structure forming device 30. As shown in FIG. 3A, the positional relationship of the protrusions 34 with respect to a photographic center 36P of the camera 32 in the opening 36 is determined as follows.

Figure 3B:
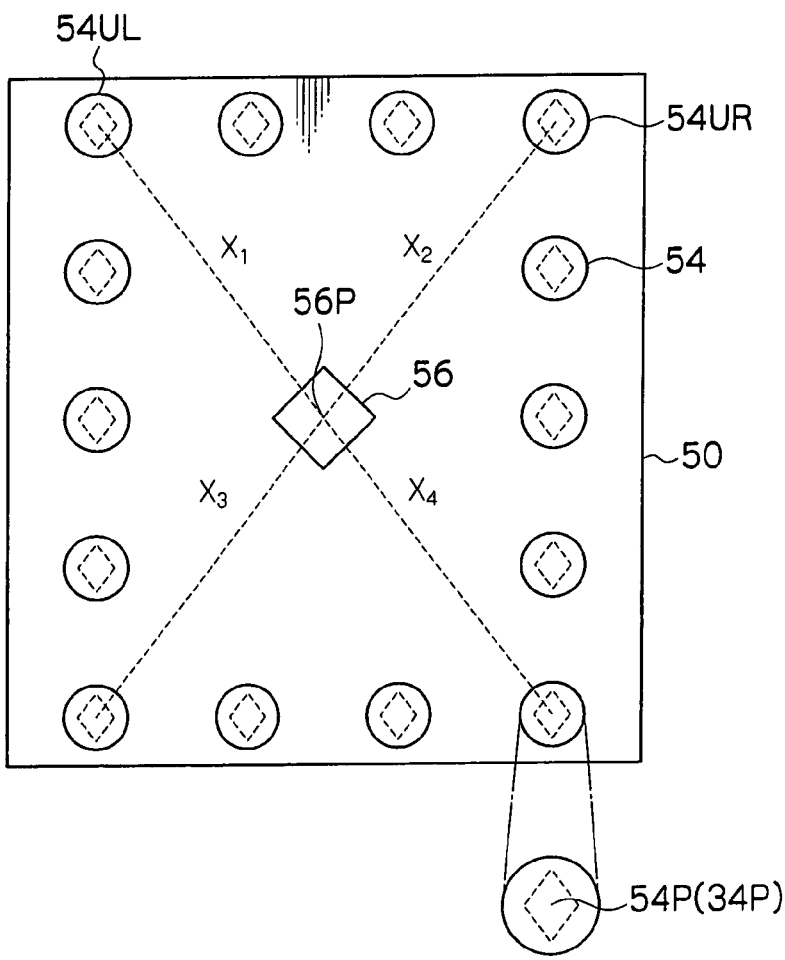
FIG. 3B is a diagram showing the positional relationship between solder bumps of a semiconductor integrated circuit and an optical communication element relating to the embodiment of the present invention.

First, as shown in FIG. 3B, plural solder bumps 54 are adhered to the surface of the semiconductor integrated circuit 50 that is to be bonded to the substrate 10. An optical communication element 56 that conducts optical communication is disposed in the center of the semiconductor integrated circuit 50. The positional relationship of the solder bumps 54 with respect to a center position 56P of the optical communication portion of the optical communication element 56 is predetermined. Namely, for example, the distance $X_1$ and direction of a solder bump 54UL disposed in the upper left corner with respect to the center position 56P, and the distance $X_2$ and direction of a solder bump 54UR disposed in the upper right corner with respect to the center position 56P, are predetermined. As shown in FIG. 3A, the positional relationship of the plural protrusions 34 of the guidance structure forming device 30 with respect to the photographic center 36P corresponds to the positional relationship of the solder bumps 54 (54UL, 54UR, etc.) of the semiconductor integrated circuit 50 with respect to the center position 56P.

Next, the action of the present embodiment will be described.

Figure 5:
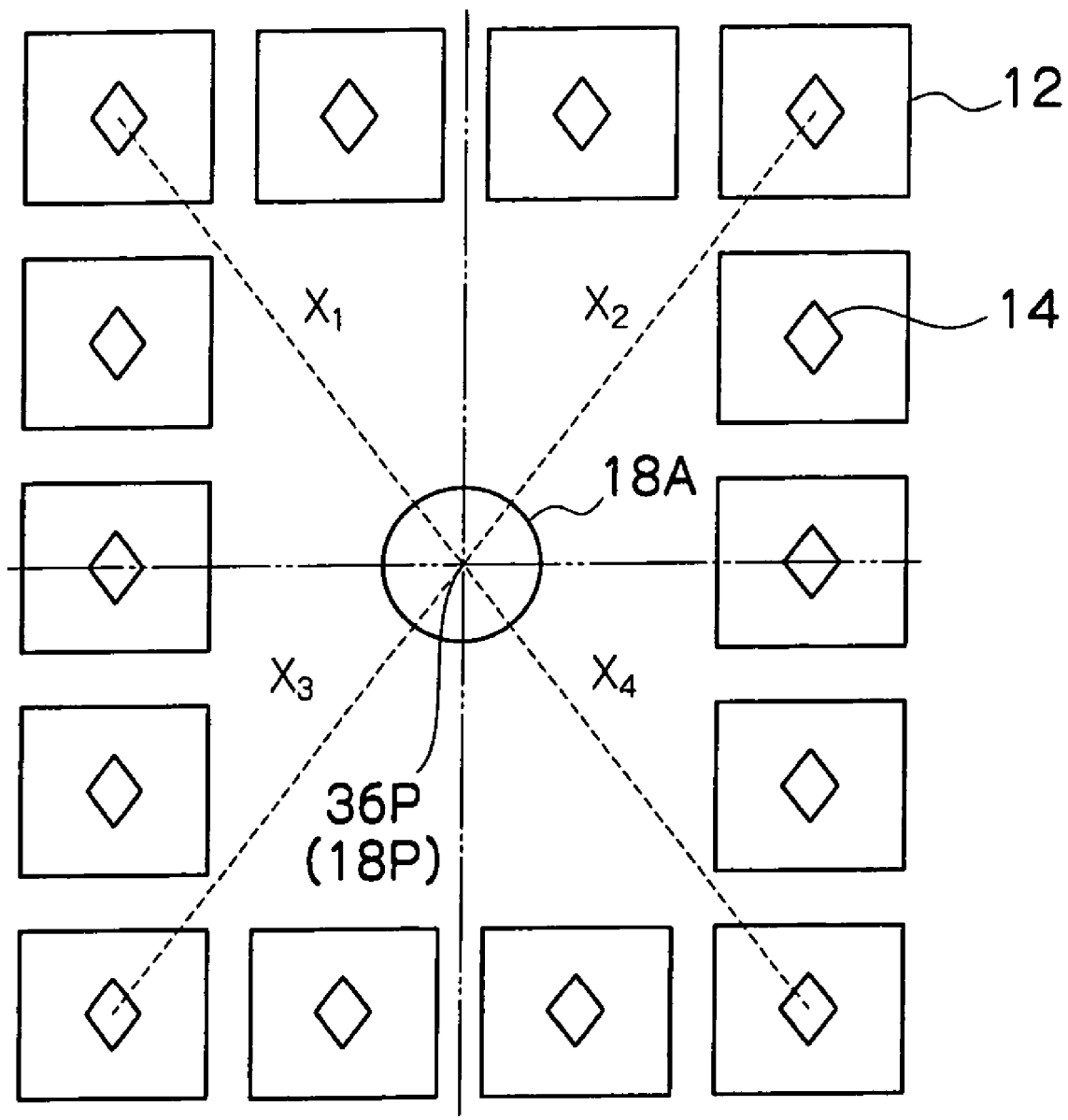
FIG. 5 is a diagram showing the positional relationship between the optical waveguide and holes formed in the contact portions.

First, the method of forming the guidance structure in the contact portions 12 of the substrate 10 will be described. As shown in FIG. 4, initially, nothing, such as the guidance structure, is formed in the contact portions 12 of the substrate 10. In the example shown in FIG. 4, a center position 18P of the end 18A of the surface of the optical waveguide 18 at the semiconductor integrated circuit side coincides with a position in the center of the plurally disposed contact portions 12. The guidance structure forming device 30 is disposed above the substrate 10 manually or using a moving device, and the substrate 10 is photographed with the camera 32. When the substrate 10 is photographed with the camera 32, the position at which the photographic center 36P of the opening 36 is positioned on the substrate 10 can be understood by analyzing an image based on the image data. Then, as shown in FIG. 5, the guidance structure forming device 30 is disposed, manually or using a moving device, so that the photographic center 36P coincides with the center position 18P of the end 18A of the optical waveguide 18. When the photographic center 36P of the opening 36 coincides with the center position 18P of the end 18A of the optical waveguide 18, the guidance structure forming device 30 is pressed against the substrate 10. As described above, the protrusions 34 are disposed on the surface 30A of the guidance structure forming device 30 opposite from the camera 32. The protrusions 34 are pressed into the contact portions 12, whereby the holes 14 serving as the guidance structure are formed in the contact surfaces 12S of the contact portions 12, as shown in FIG. 5.

Here, because the positional relationship of the plural protrusions 34 with respect to the opening 36 corresponds to the positional relationship of the solder bumps 54 of the semiconductor integrated circuit 50 shown in FIG. 3B with respect to the center position 56P of the optical communication portion of the optical communication element 56, the positional relationship of the holes 14 formed as described above with respect to the center position 18P of the optical waveguide 18 can also be made to correspond to the positional relationship of the solder bumps 54 of the semiconductor integrated circuit 50 with respect to the center position 56P. The insides of the holes 14 formed in this manner are the predetermined regions.

Figure 6:
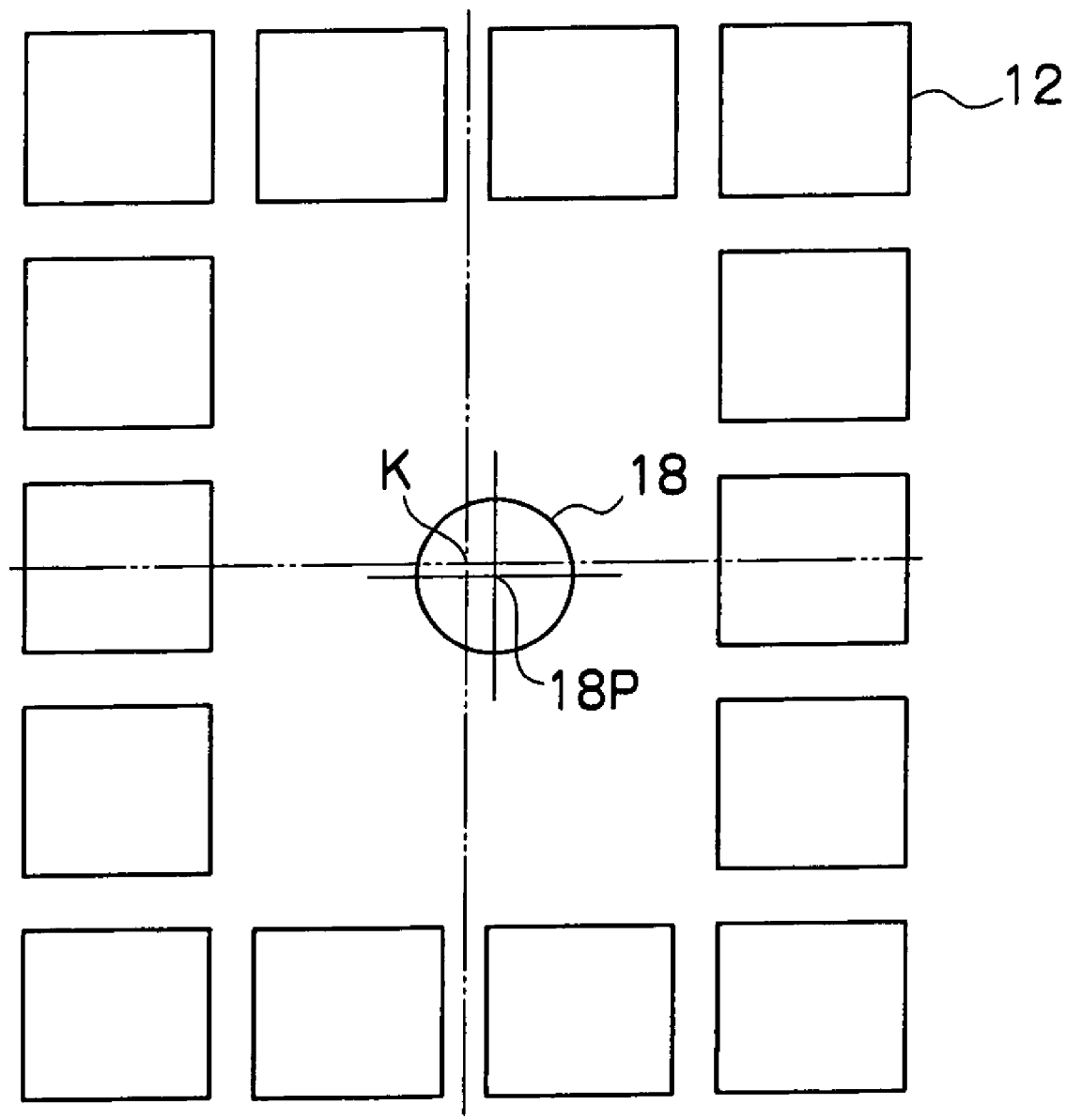
FIG. 6 is another diagram showing the positional relationship between the contact portions and the optical waveguide.
Figure 7:
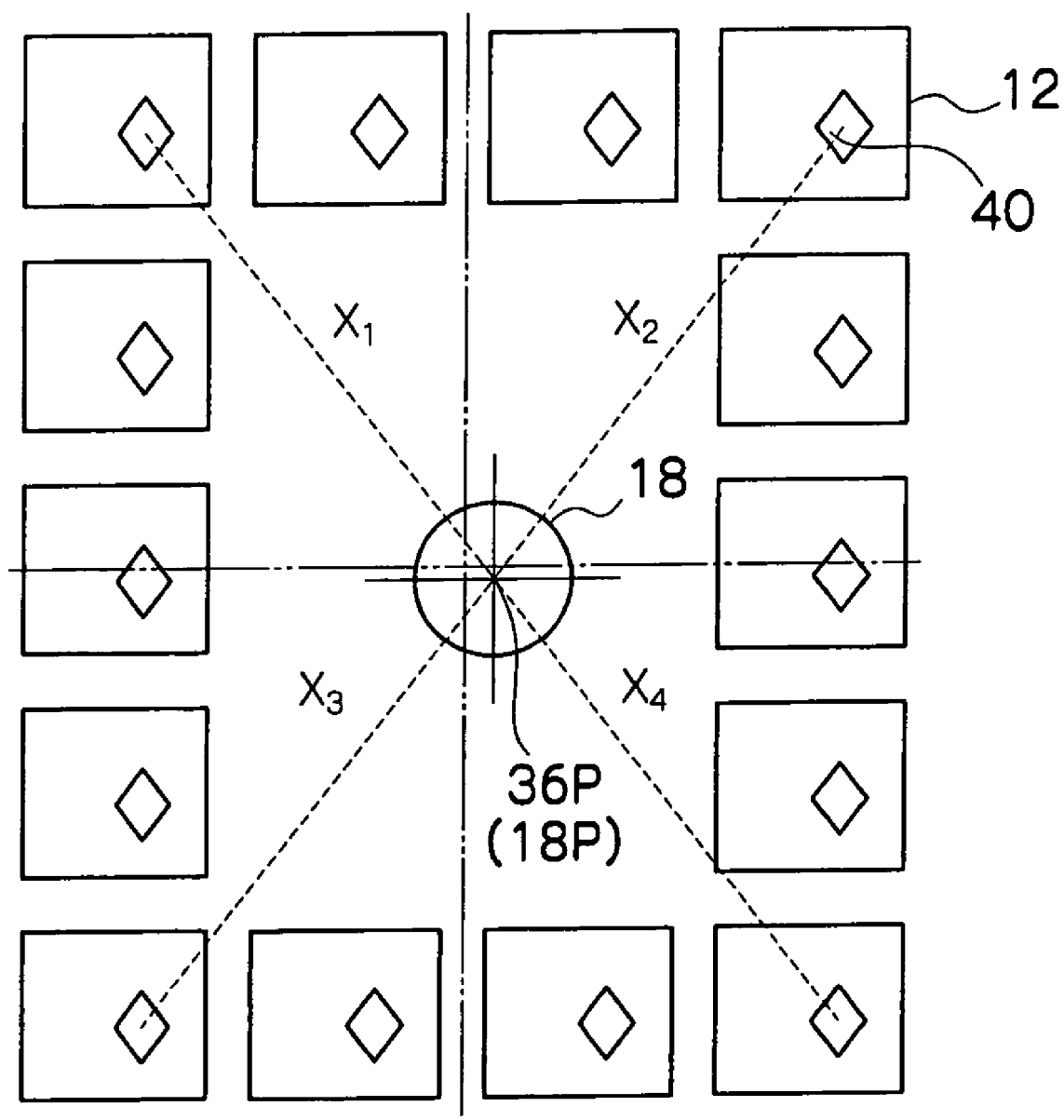
FIG. 7 is another diagram showing the positional relationship between the optical waveguide and the holes formed in the contact portions.

In the example shown in FIG. 4, the center position 18P of the optical waveguide 18 coincides with the center of the plurally disposed contact portions 12, but as shown in FIG. 6, there are also cases where the center position 18P of the optical waveguide 18 does not always coincide with a center position K of the plurally disposed contact portions 12. Even in such cases, the photographic center 36P of the guidance structure forming device 30 can be made to coincide with the center position 18P of the optical waveguide 18, so that even if the center position 18P is offset from the center position K, the positional relationship of the holes 14 in the contact portions 12 with respect to the center position 18P of the optical waveguide 18 can be made to correspond to the positional relationship of the solder bumps 54 of the semiconductor integrated circuit 50 with respect to the center position 56P of the optical communication portion of the optical communication element 56, because the holes 14 are formed as the guidance structure in the contact surfaces 12S of the contact portions 12 by the protrusions 34.

In this manner, the substrate 10 is fabricated. Namely, the holes 14 serving as the guidance structure are formed in the contact portions 12 disposed in the substrate 10.

Figure 8:
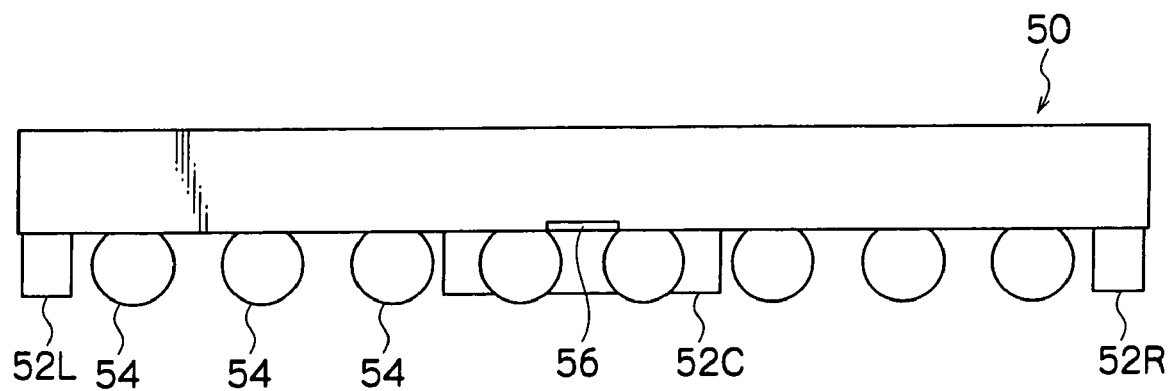
FIG. 8 is a cross-sectional view of the semiconductor integrated circuit.
Figure 9:
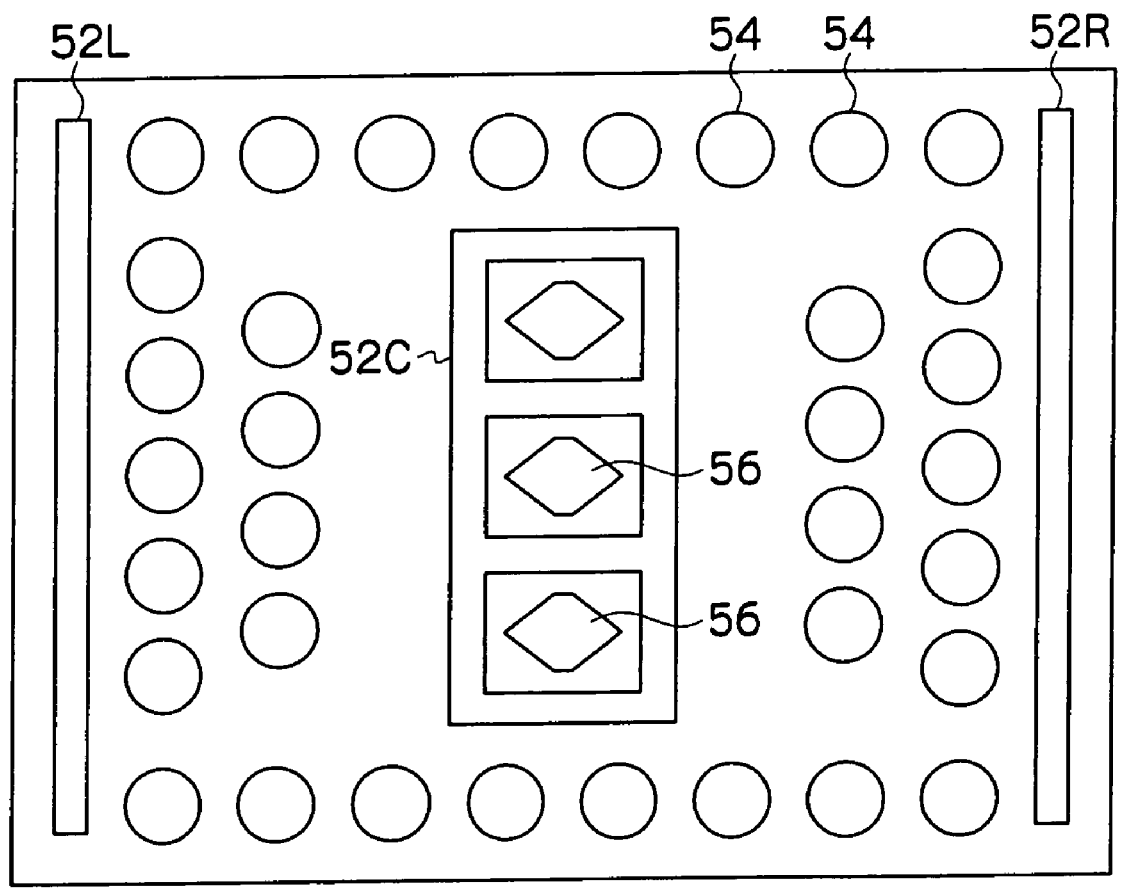
FIG. 9 is a diagram showing a surface of the semiconductor integrated circuit that is bonded to the substrate.

The semiconductor integrated circuit 50 shown in FIG. 3B is only one example and is schematically shown. In actuality, the semiconductor integrated circuit 50 is disposed with plural (e.g., three) optical communication elements 56, and plural solder bumps 54 are adhered around the optical communication elements 56, as shown in FIGS. 8 and 9.

In the present embodiment, the semiconductor integrated circuit 50 is disposed with plates 52L, 52R and 52C serving as space regulating members. The pair of plates 52L and 52R are disposed at both end sides of the semiconductor integrated circuit 50, and the plate 52C is disposed surrounding the optical communication elements 56.

Next, the method of bonding the semiconductor integrated circuit 50 to the substrate 10 will be described.

Figure 10:
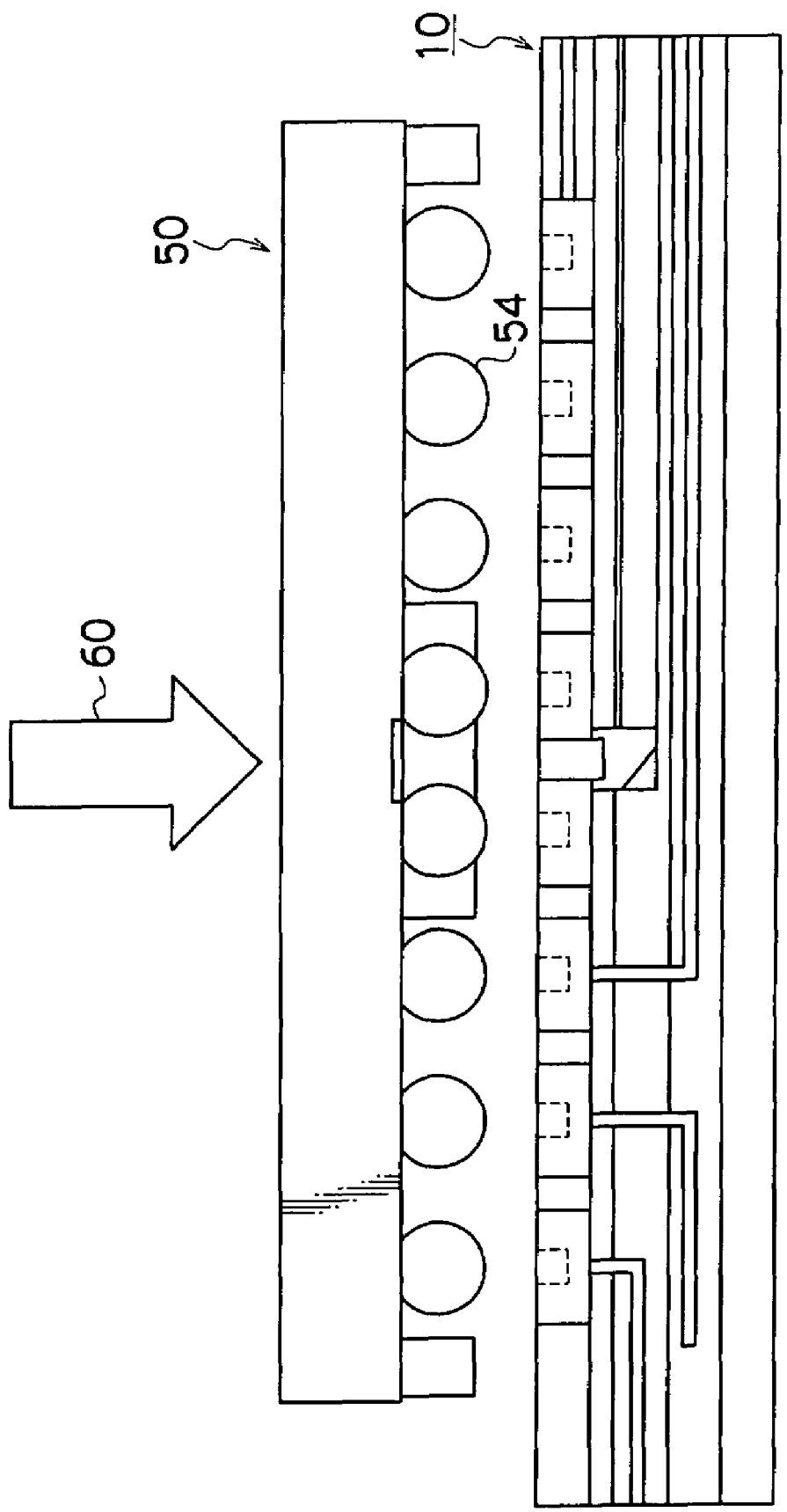
FIG. 10 is a diagram showing the semiconductor integrated circuit being bonded to the substrate.
Figure 11:
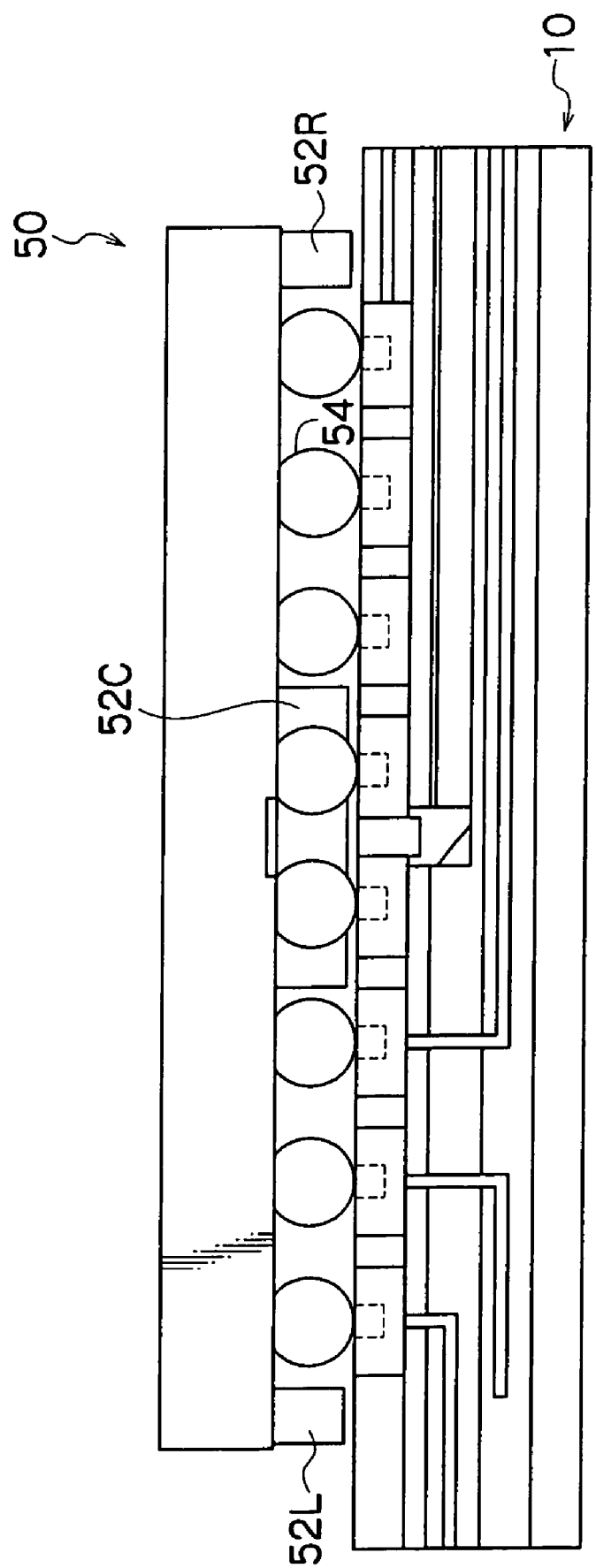
FIG. 11 is a diagram showing the semiconductor integrated circuit being disposed on the substrate.

As shown in FIG. 10, the semiconductor integrated circuit 50 is suctioned by a sucking unit 60 of an unillustrated moving device and moved above the substrate 10. As shown in FIG. 11, the semiconductor integrated circuit 50 is placed on the substrate 10 so that the solder bumps 54 of the semiconductor integrated circuit 50 contact the contact portion 12.

Because the diameter of each of the solder bumps 54 is larger than the height of the plates 52L, 52C and 52R, a slight gap is formed between the substrate 10 and the plates 52L, 52C and 52R.

Figure 12:
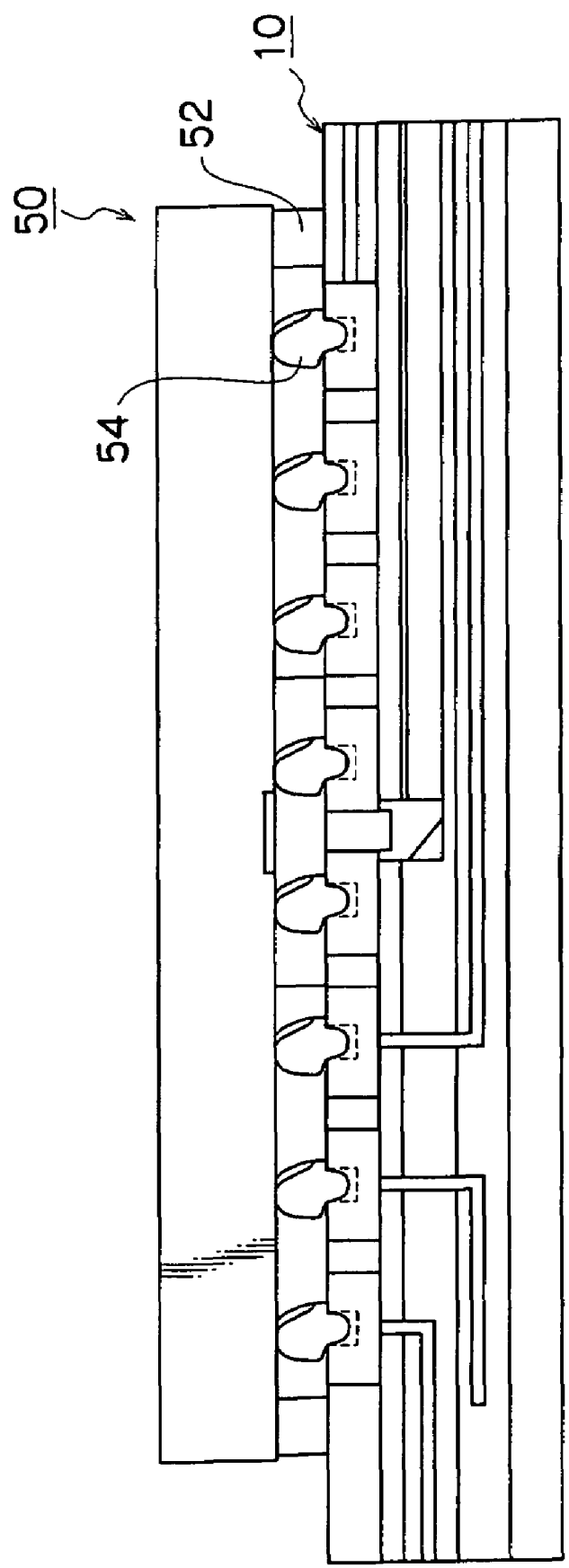
FIG. 12 is a diagram showing the semiconductor integrated circuit being disposed on the substrate and heated so that the solder bumps are melted.

Next, as shown in FIG. 12, the solder bumps 54 are melted. Namely, the semiconductor integrated circuit 50 and the substrate 10 are heated.

Figure 13:
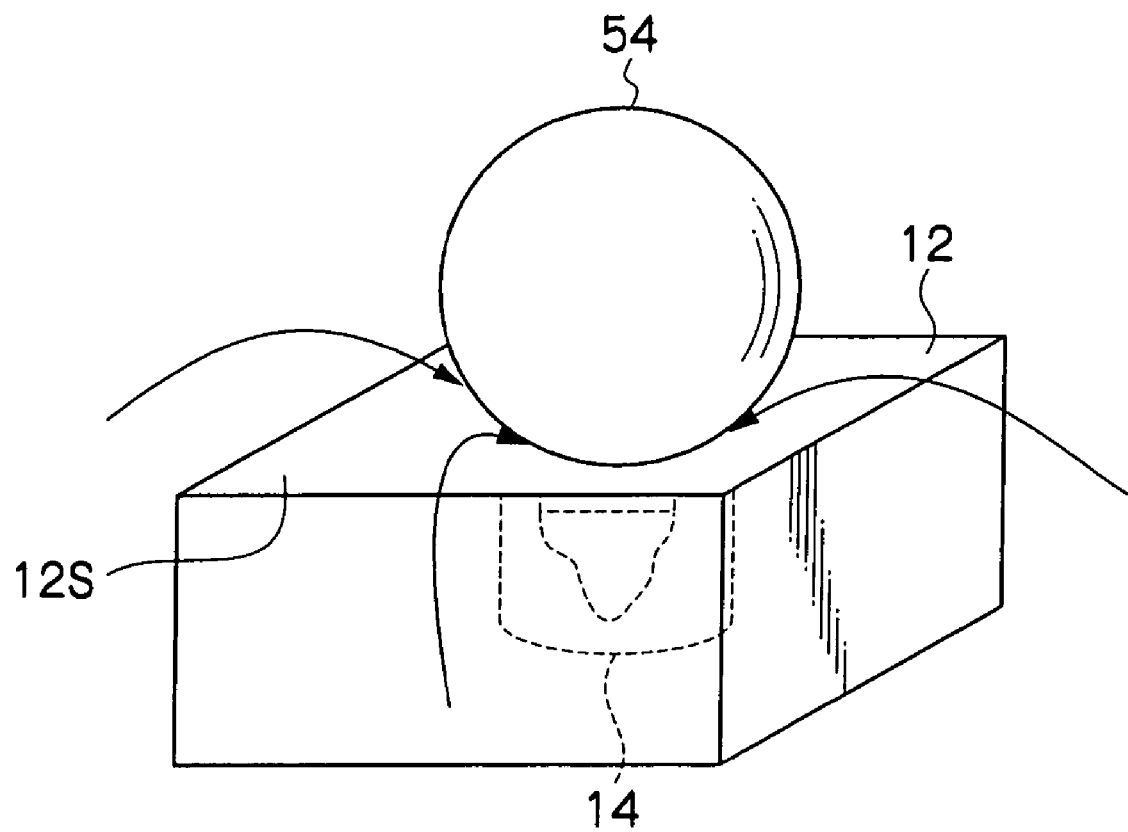
FIG. 13 is a diagram showing a solder bump melting and entering a hole.

When the semiconductor integrated circuit 50 and the substrate 10 are heated in this manner, the solder bumps 54 are melted and become deformed. As shown in FIG. 13, the solder bumps 54 move (flow) into the holes 14 (predetermined regions) due to gravity and surface tension because the holes 14 are formed in the contact surfaces 12S of the contact portions 12. As described above, because the solder bumps 54 are adhered to the semiconductor integrated circuit 50, the entire semiconductor integrated circuit 50 moves when the solder bumps 54 enter the holes 14. Thus, the center positions of the solder bumps 54 coincide with the holes 14 disposed in the contact surfaces 12S of the contact portions 12.

As described above, because the positional relationship of the holes 14 with respect to the center position 18P of the optical waveguide 18 corresponds to the positional relationship of the solder bumps 54 with respect to the optical communication center position 56P of the optical communication element 56, the center position 56P of the optical communication element 56 eventually coincides with the center 18P of the optical waveguide 18.

Figure 14:
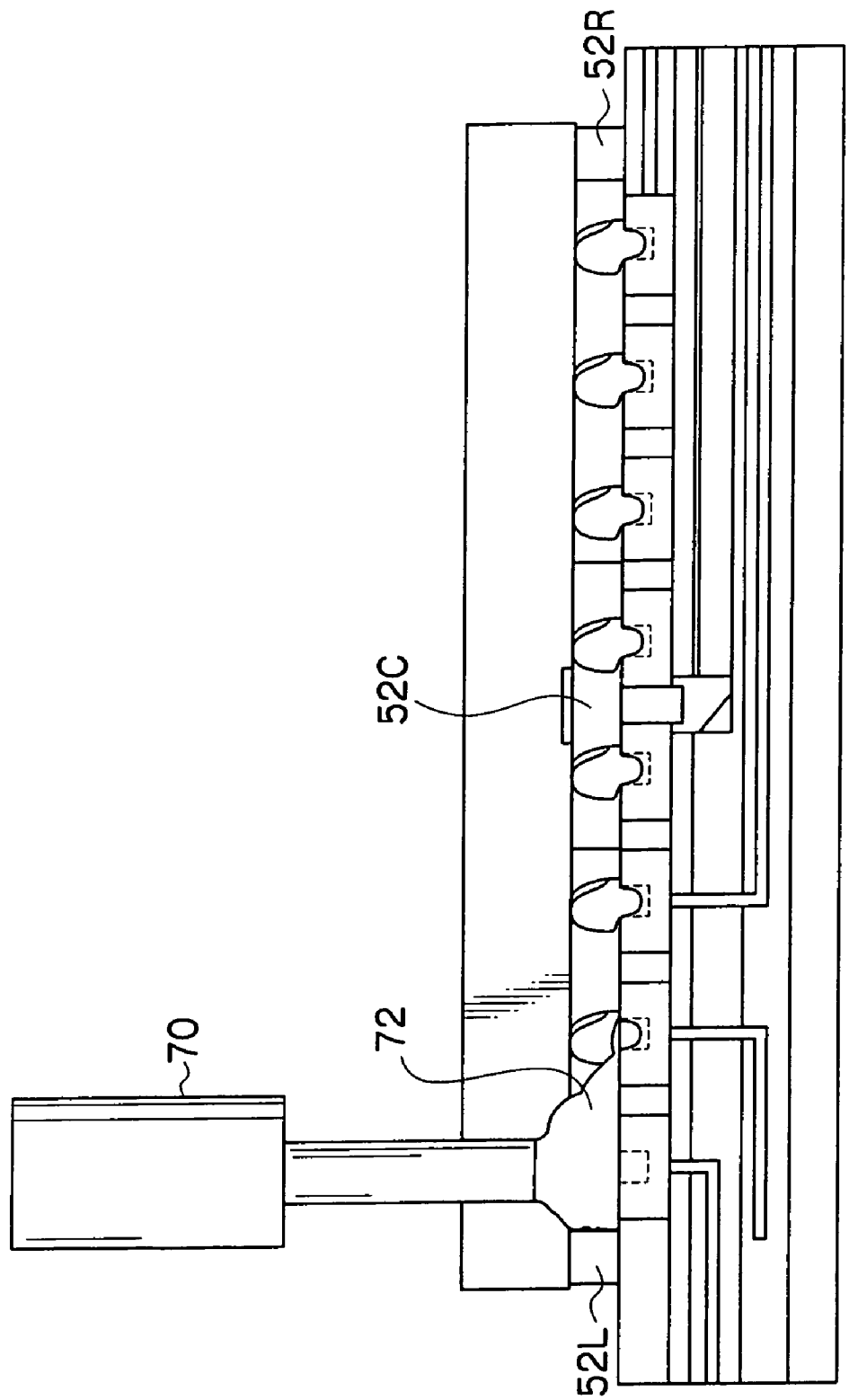
FIG. 14 is a diagram showing underfill being supplied.
Figure 15C:
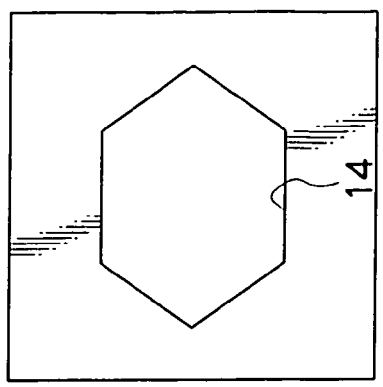
FIGS. 15A to 15E are diagrams showing modified examples of the holes.
Figure 15E:
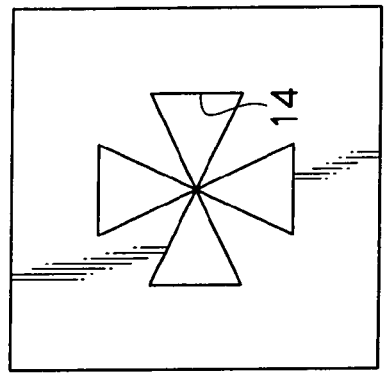
Figure 15B:
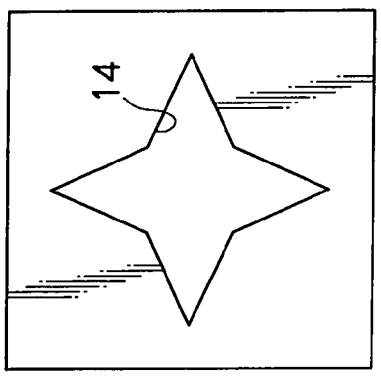
Figure 15D:
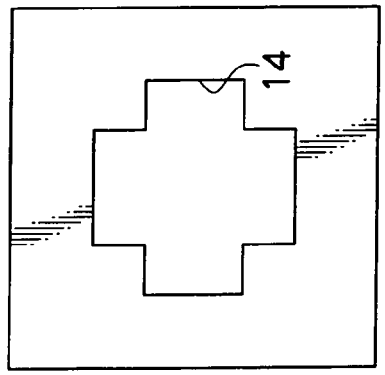
Figure 15A:
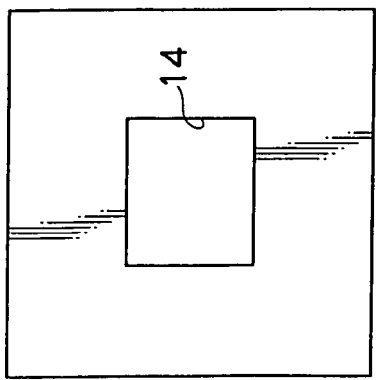

Then, as shown in FIG. 14, underfill 72 is supplied between the semiconductor integrated circuit 50 and the substrate 10 from an underfill supply device 70.

As described above, because the optical communication elements 56 are surrounded by the plate 52C as shown in FIG. 9, the underfill 72 is blocked by the plate 52C and does not reach the optical communication elements 56 even when the underfill 72 is supplied between the semiconductor integrated circuit 50 and the substrate 10, so that complete optical communication can be realized.

In the embodiment described above, the shapes of the holes 14 formed in the contact portions 12 were circular or square, but the invention is not limited thereto. Various shapes can be applied, as shown in FIGS. 15A to 15E.

Also, in the embodiment described above, the holes 14 were formed in the contact surfaces 12S of the contact portions 12, but the invention is not limited thereto. A material that has a low affinity with solder, such as a heat-resistant member like solder resist, may also be applied to the contact surfaces 12S so as to surround the predetermined regions.

Figure 16B:
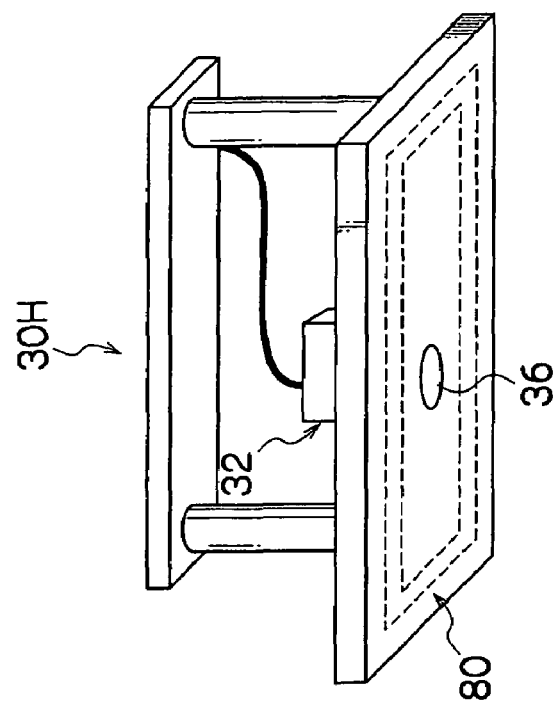
FIGS. 16A and 16B are diagrams showing a guidance structure forming device pertaining to a modified example.
Figure 16A:
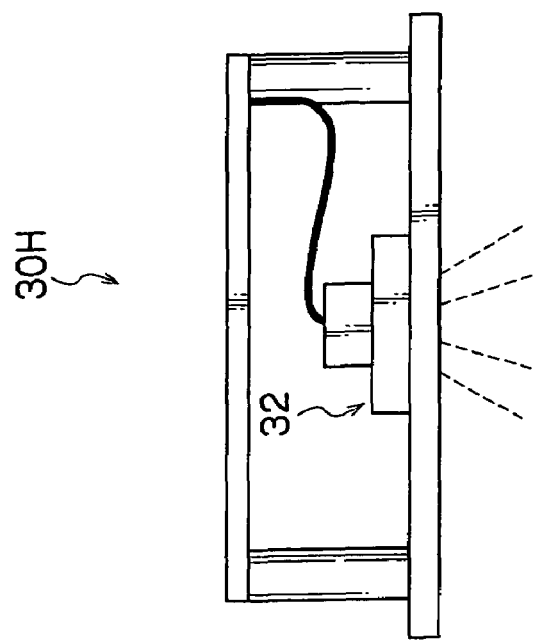

FIGS. 16A and 16B show a guidance structure forming device 30H for realizing this. Because the guidance structure forming device 30H pertaining to the present modified example includes constituent portions that are the same as those of the guidance structure forming device 30 (see FIGS. 2A and 2B), the same reference numerals will be given to those same constituent portions, description thereof will be omitted, and only the different portions will be described.

As shown in FIGS. 16A and 16B, the surface 30A of the guidance structure forming device 30 opposite from the camera 32 includes plural nozzles 80 that supply solder resist so as to surround certain regions. The example shown in FIG. 16B is simply one example, and as shown in FIGS. 17A and 17B, various types of nozzles 82 and 84 can be applied.

Figure 18:
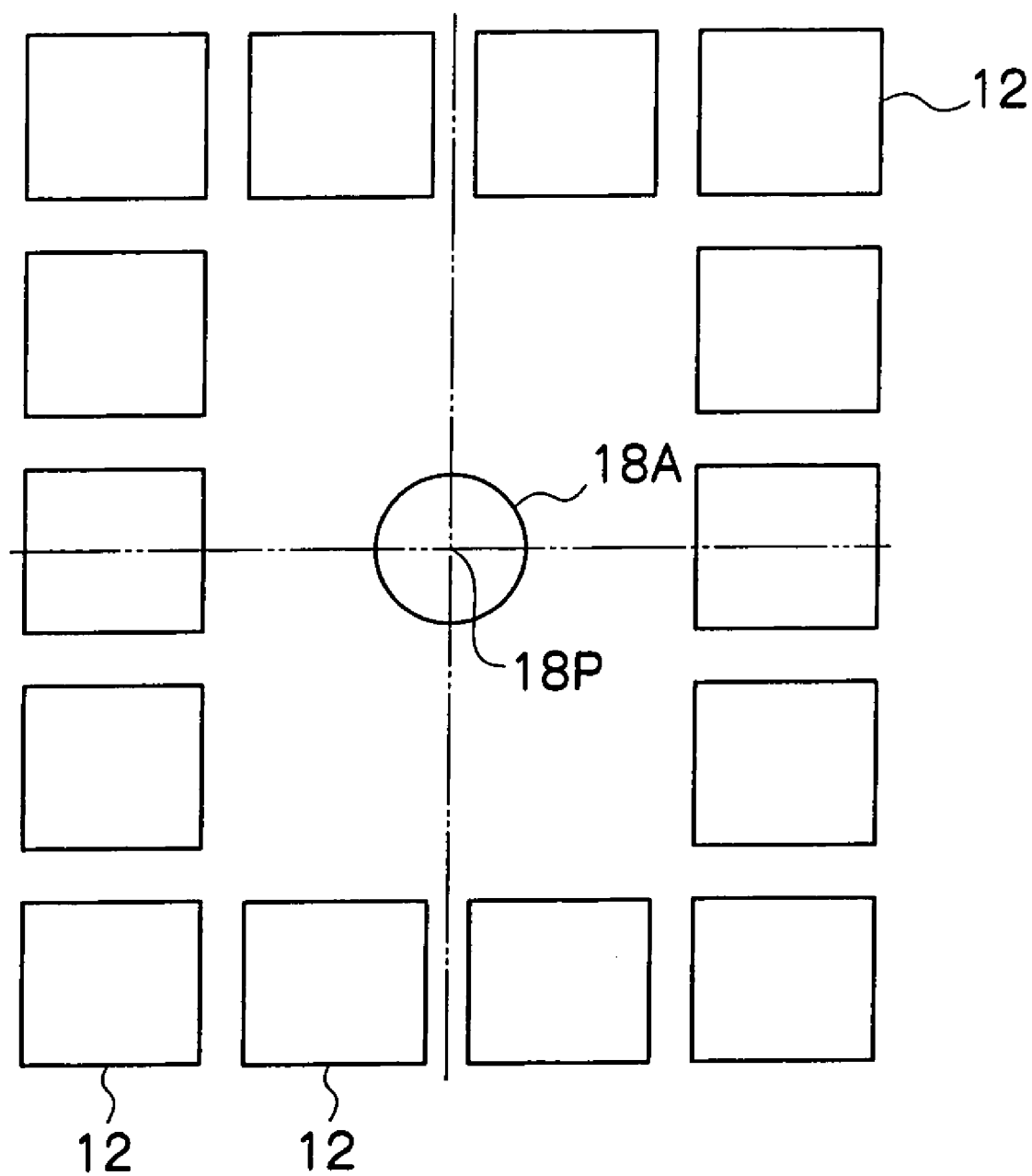
FIG. 18 is a diagram showing the positional relationship between the contact portions and the optical waveguide.
Figure 20:
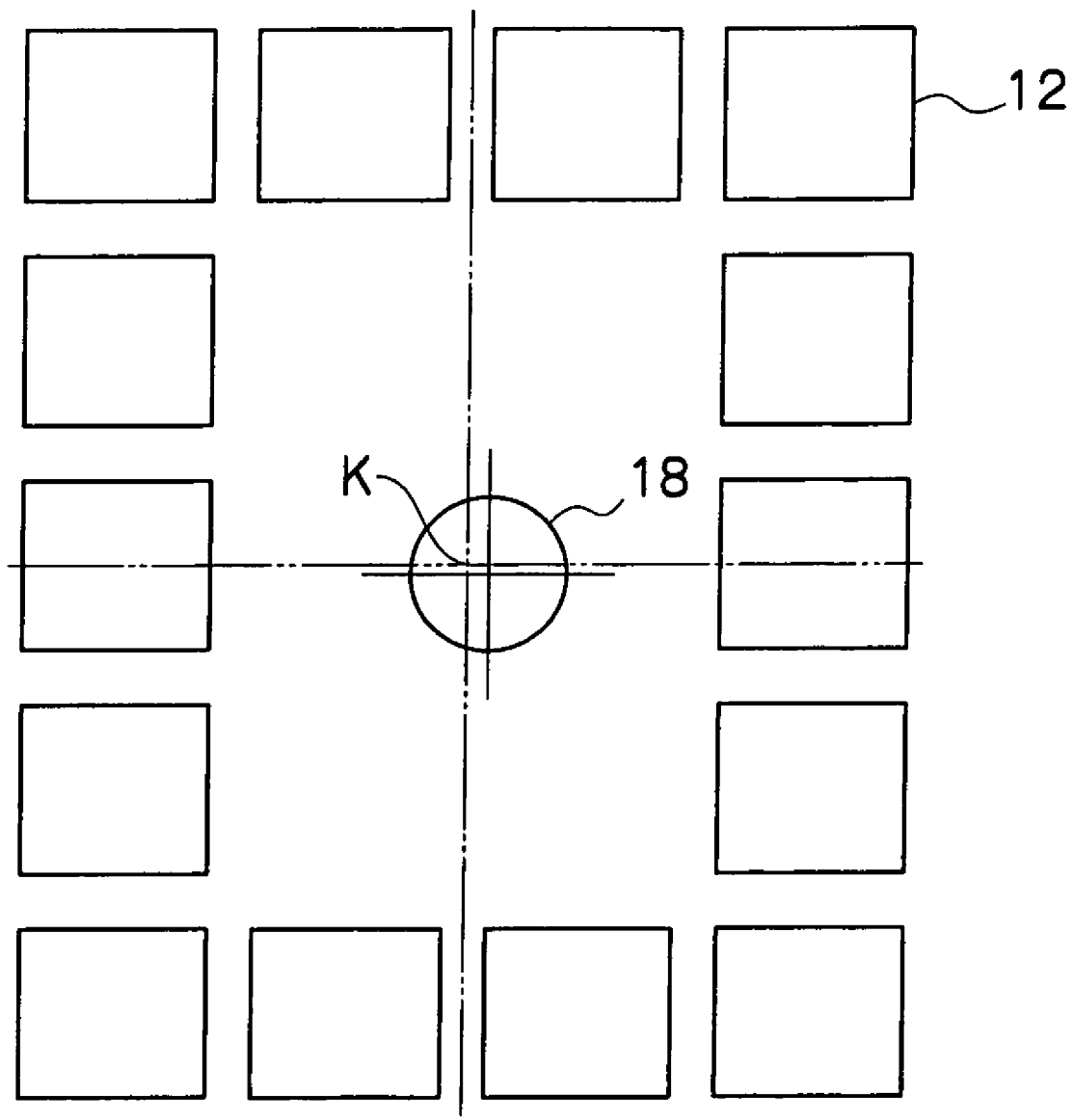
FIG. 20 is another diagram showing the positional relationship between the contact portions and the optical waveguide.

Here, FIG. 18 shows the same substrate 10 as in FIG. 4, and FIG. 20 shows the same substrate 10 as in FIG. 6.

Figure 19:
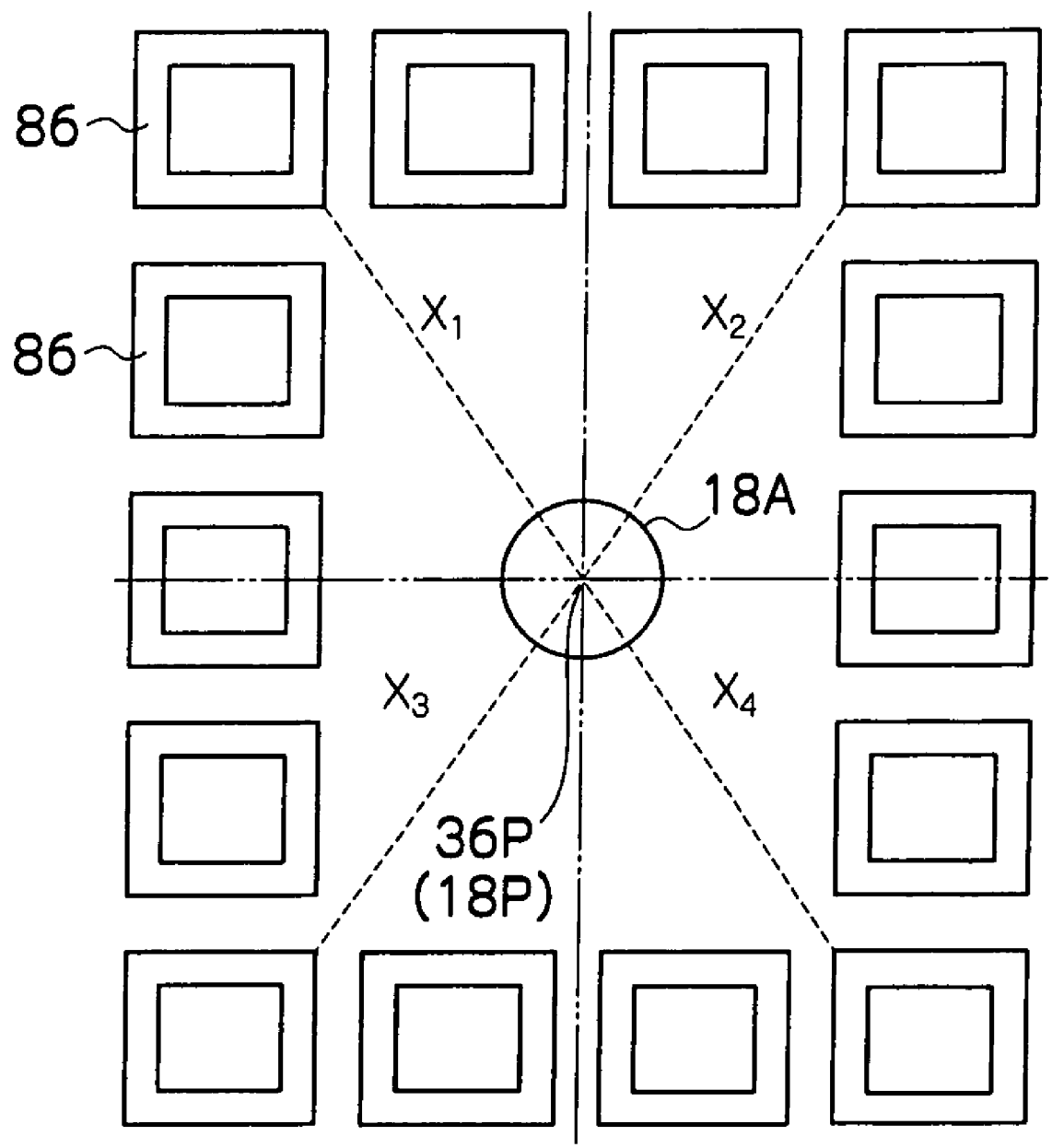
FIG. 19 is a diagram showing the positional relationship between the optical waveguide and the holes formed in the contact portions.
Figure 21:
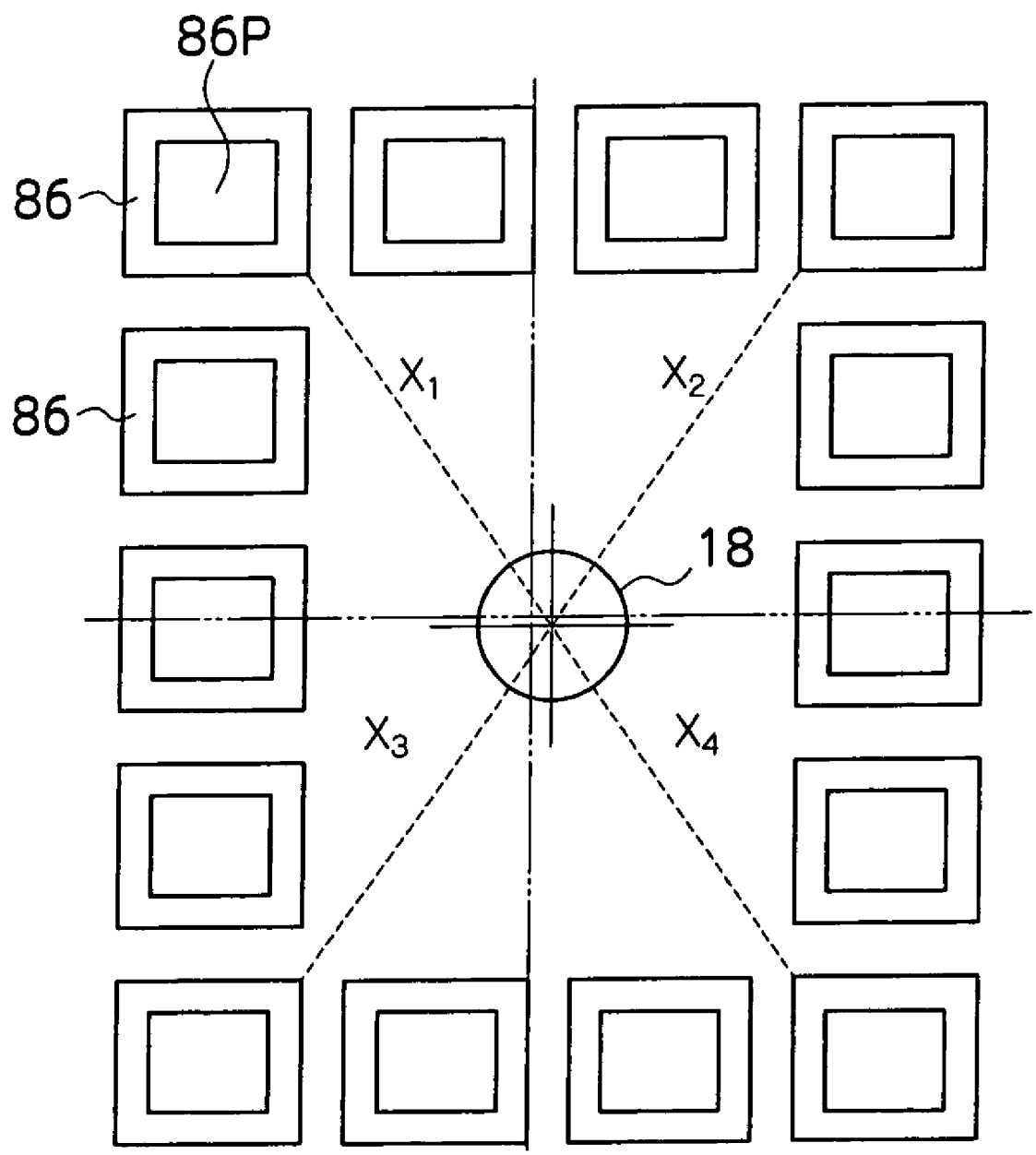
FIG. 21 is another diagram showing the positional relationship between the optical waveguide and the holes formed in the contact portions.

As shown in FIGS. 19 and 21, the solder resist is applied by the nozzles 80, 82 and 84 to the contact surfaces 12S of the contact portions 12 to as to surround certain regions.

Figure 17B:
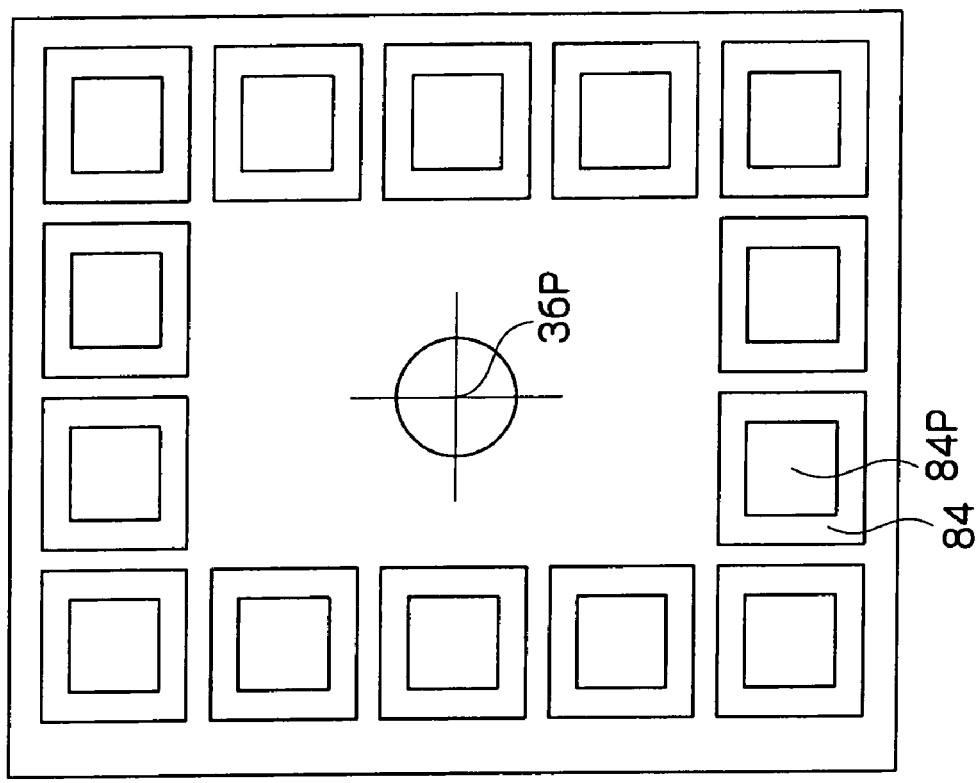
FIGS. 17A and 17B are diagrams showing two other examples of the guidance structure forming device.
Figure 17A:
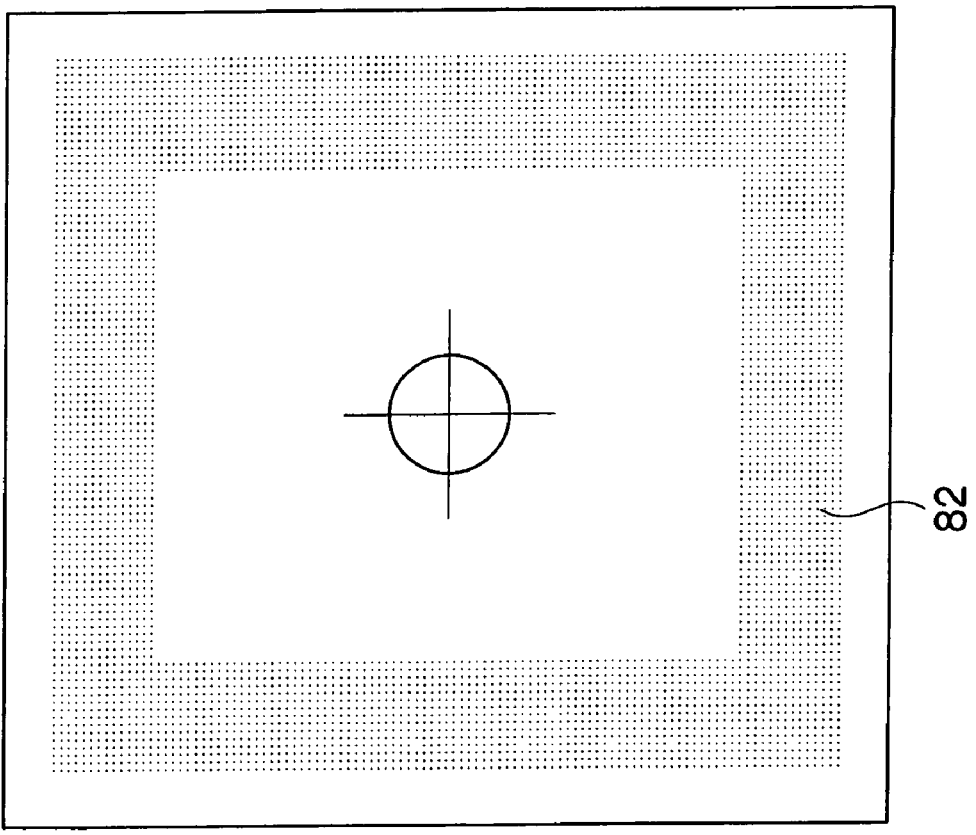

Here, as shown in FIG. 17B, for example, the positional relationship of centers 84P of the certain regions surrounded by the solder resist applied by the nozzles 84 with respect to the photographic center 36P corresponds to the positional relationship of the solder bumps 54 of the semiconductor integrated circuit 50 with respect to the center position 18P of the optical waveguide 18. Thus, for example, as shown in FIG. 18, when the center position 18P of the end 18A of the light guide 18 coincides with the position at the center of the plurally disposed contact portions 12, the guidance structure forming device 30H is disposed so that the photographic center 36P coincides with the center position 18P, and solder resist 86 is applied to the contact surfaces 12S of the contact portions 12 by the nozzles 80 so as to surround certain regions. When the solder resist 86 is applied in this manner, the certain regions surrounded thereby become the predetermined regions.

As shown in FIG. 20, even when the center position 18P of the optical waveguide 18 does not coincide with the center position K of the plurally arranged contact portions 12, the photographic center 36P of the guidance structure forming device 30H can be made to coincide with the center position 18P of the optical waveguide 18, and by forming the solder resist as described above, the positional relationship of center positions 86P of the regions surrounded by the solder resist (predetermined regions) with respect to the center position 18P of the optical waveguide 18 can be made to correspond to the positional relationship of the solder bumps 54 with respect to the optical communication center position 56P of the optical communication element 56.

As described above, in the present embodiment, in a substrate that is to be adhered to a semiconductor integrated circuit, when solder bumps are melted to contact surfaces of plural contact portions that contact the solder bumps, the melted solder bumps can be guided to predetermined regions within the contact surfaces. Thus, by accurately positioning the predetermined regions using their relationship with the semiconductor integrated circuit and melting the solder bumps when the semiconductor integrated circuit and the substrate are to be bonded, the solder bumps contacting the contact surfaces are guided by the guidance structure to the predetermined regions. As a result, the semiconductor integrated circuit and the substrate can be accurately positioned.

Namely, the present invention provides a substrate, a device and method for forming a guidance structure in the substrate, and a positioning method that can accurately position the substrate and a semiconductor integrated circuit.

The substrate pertaining to the invention is bonded to a semiconductor integrated circuit. Plural solder bumps are adhered to the semiconductor integrated circuit. The substrate includes, at positions corresponding to the positions of the solder bumps, plural contact portions that contact the solder bumps because the substrate is bonded to the semiconductor integrated circuit.

In the present invention, the contact surfaces of the plural contact portions have a guidance structure which guides the melted solder bumps to predetermined regions within the contact surfaces when the solder bumps are melted. The guidance structure may include holes formed in the predetermined regions, or a substance having a low affinity with solder may be applied, as the guidance structure, to the contact surfaces so as to surround the predetermined regions.

A heat-resistant coating material, such as solder resist, can be used as the substance having a low affinity with solder. The "low affinity" also includes an affinity of zero, but is not limited to this and refers to an affinity of an extent to which the substance does not bond to the solder.

The invention may also be configured so that the semiconductor integrated circuit includes an optical communication element that conducts optical communication, the substrate includes an optical waveguide used for the optical communication, and the positional relationship between an end of a surface of the optical waveguide at the semiconductor integrated circuit side and the predetermined regions of the plural contact surfaces corresponds to the positional relationship between the optical communication element and the plural solder bumps.

In the semiconductor circuit, in order to conduct optical communication using the optical communication element, it is necessary for the light for optical communication of the optical communication element to progress through the optical waveguide disposed in the substrate. For this reason, it becomes necessary for the semiconductor integrated circuit and the substrate to be accurately positioned so that the light for optical communication of the optical communication element to progress through the optical waveguide.

Thus, in the present invention, the positional relationship between an end of the optical waveguide at a surface of the semiconductor integrated circuit side and the predetermined regions of the plural contact surfaces is configured to correspond to the positional relationship between the optical communication element and the plural solder bumps.

The contact surfaces include a guidance structure which, when the semiconductor integrated circuit and the substrate are to be bonded together, i.e., when the solder bumps and the contact surfaces are to be brought into contact with each other, guides the melted solder bumps to the predetermined regions within the contact surfaces when the solder bumps are melted, even if the center of the solder bumps is somewhat offset from the center of the contact surfaces. At this time, not only are the melted solder bumps guided to the predetermined regions, but the entire semiconductor integrated circuit moves because the solder bumps are adhered to the semiconductor integrated circuit.

Here, as described above, the positional relationship between an end of the optical waveguide at a surface of the semiconductor integrated circuit side and the predetermined regions of the plural contact surfaces is configured to correspond to the positional relationship between the optical communication element and the plural solder bumps.

Thus, when the solder bumps are guided to the predetermined regions, the entire semiconductor integrated circuit also moves as described above. As a result, the optical communication element corresponds to the end of the optical waveguide at the surface of the semiconductor integrated circuit side. Thus, the semiconductor integrated circuit and the substrate can be accurately positioned so that the light for optical communication of the optical communication element progresses through the optical waveguide.

As described above, in the substrate that is bonded to the semiconductor integrated circuit, the contact surfaces of the plural contact portions that contact the solder bumps have a guidance structure that guides the melted solder bumps to the predetermined regions within the contact surfaces when the solder bumps are melted. Thus, by accurately positioning the predetermined regions using their relationship with the semiconductor integrated circuit and melting the solder bumps when the semiconductor integrated circuit and the substrate are to be bonded, the solder bumps contacting the contact surfaces are guided by the guidance structure to the predetermined regions. As a result, the semiconductor integrated circuit and the substrate can be accurately positioned. The substrate according to the invention may further include a space regulating member that regulates a space between the semiconductor integrated circuit and the substrate when the semiconductor integrated circuit and the substrate are bonded together. Thus, the space between the semiconductor integrated circuit and the substrate can be made into a regulated space.

In order to accurately position the semiconductor integrated circuit and the substrate, it is necessary for the guidance structure to accurately guide the solder bumps to the predetermined regions.

In order to realize this, a guidance structure forming device which, in a substrate that is bonded to a semiconductor integrated circuit to which a plurality of solder bumps has been adhered and includes a plurality of contact portions having respective contact surfaces which contact the solder bumps, forms a plurality of guidance structures in the contact surfaces is provided. The guidance structure forming device includes: a support substrate in which an opening is formed; a photographing unit that photographs via the opening; and a plurality of guidance structure forming portions that forms the plurality of guidance structures and is disposed in a surface of the support substrate opposite to the photographing unit side, with the positional relationship of the plurality of guidance structure forming portions with respect to a photographic center position of the photographing unit in the opening corresponding to the positional relationship of the plurality of solder bumps with respect to an optical communication element attached to the semiconductor integrated circuit, wherein when the solder bumps are melted, the formed guidance structures guide the melted solder bumps to predetermined regions within the contact surfaces.

In the device for forming the guidance structure in the substrate according to the invention, the guidance structure forming portions may include protrusions that form holes in the contact surfaces, or application portions that apply, to the contact surfaces, a substance having a low affinity with solder so as to surround the predetermined regions.

Namely, the present invention can be realized as a guidance structure forming device that forms a guidance structure in contact surfaces of plural contact portions of a substrate that is bonded to a semiconductor integrated circuit to which plural solder bumps have been adhered, with the contact portions being disposed at positions corresponding to the positions of the plural solder bumps and the guidance structure guides the melted solder bumps to predetermined regions within the contact surfaces when the solder bumps are melted.

An opening is formed in the support substrate, and the photographing unit photographs via the opening.

Thus, even if the guidance structure forming device is superposed over the substrate, the superposed state thereof can be understood on the basis of an image obtained by photography.

In the present invention, plural guidance structure forming portions that form the guidance structure are disposed in the surface of the support substrate opposite from the photographing unit.

The positional relationship of the guidance structure forming portions with respect to the photographic center position of the photographing unit in the opening corresponds to the positional relationship of the plural solder bumps with respect to the optical communication element.

Thus, when the guidance structure forming portions form the guidance structure in the contact surfaces, the positional relationship of the positions of the guidance structure with respect to the predetermined positions corresponds to the positional relationship of the plural solder bumps with respect to the optical communication element.

Thus, when the guidance structure forming device is disposed, manually or using a moving mechanism, so that the photographic center position of the photographing unit in the opening is positioned at the predetermined position and the guidance structure forming portions form the guidance structure in the contact surfaces, the guidance structure can be positioned at the right positions, and the guidance structure can accurately guide the solder bumps to the predetermined positions.

According to the present invention, a method of forming a guidance structure in a substrate that is bonded to a semiconductor integrated circuit to which a plurality of solder bumps has been adhered is also provided. The method includes: providing a substrate including a plurality of contact portions that is disposed at positions corresponding to the plurality of solder bumps, each of the plurality of contact portions having a contact surface which contacts one of the plurality of solder bumps; and operating a guidance structure forming device to form a plurality of guidance structures in the respective contact surfaces, wherein the guidance structure forming device includes a support substrate in which an opening is formed, a photographing unit that photographs via the opening, and a plurality of guidance structure forming portions that forms the plurality of guidance structures and is disposed in a surface of the support substrate opposite to the photographing unit side, with the positional relationship of the plurality of guidance structure forming portions with respect to a photographic center position of the photographing unit in the opening corresponding to the positional relationship of the plurality of solder bumps with respect to an optical communication element attached to the semiconductor integrated circuit, and when the solder bumps are melted, the formed guidance structures guide the melted solder bumps to predetermined regions within the contact surfaces.

Further, a method of positioning a substrate and a semiconductor integrated circuit is provided. The method includes: bonding, to a semiconductor integrated circuit to which a plurality of solder bumps has been adhered, a substrate including a plurality of contact portions that is disposed at positions corresponding to the plurality of solder bumps, each of the plurality of contact portions having a contact surface which contacts the corresponding solder bump, so that the solder bumps and the contact portions contact each other, with the substrate including a guidance structure that is disposed in each of the plurality of contact surfaces and guides melted solder bump to a predetermined region within the contact surface, with the predetermined region being set so that the semiconductor integrated circuit and the substrate are properly aligned; melting the solder bumps; and positioning the semiconductor integrated circuit with respect to the substrate by using the guidance structure to cause the melted solder bumps to flow to the predetermined regions.

Namely, after the substrate according to the invention and the semiconductor integrated circuit to which plural solder bumps have been adhered are bonded so that the solder bumps and the contact portions contact each other, the solder bumps are melted, whereby the solder bumps that contact the contact surfaces are guided to the predetermined regions by the guidance structure. As a result, the semiconductor integrated circuit and the substrate can be accurately positioned.

Furthermore, according to the present invention, a substrate that is bonded to a semiconductor integrated circuit to which a plurality of solder bumps has been adhered is provided. The substrate including: a plurality of contact portions that is disposed at positions corresponding to the plurality of solder bumps, each of the plurality of contact portions having a contact surface which contacts the corresponding solder bump; and a plurality of guidance structures that is disposed in the plurality of contact surfaces and, when the solder bumps are melted, guides the melted solder to predetermined regions within the contact surfaces, with the guidance structures being formed by a guidance structure forming device, wherein the guidance structure forming device includes a support substrate in which an opening is formed, a photographing unit that photographs via the opening, and a plurality of guidance structure forming portions that forms the plurality of guidance structures and is disposed in a surface of the support substrate opposite to the photographing unit side, with the positional relationship of the plurality of guidance structure forming portions with respect to a photographic center position of the photographing unit in the opening corresponding to the positional relationship of the plurality of solder bumps with respect to an optical communication element attached to the semiconductor integrated circuit.

As described above, in a substrate to which a semiconductor integrated circuit is to be bonded, contact surfaces of plural contact portions that contact solder bumps include a guidance structure that guides the melted solder bumps to predetermined regions within the contact surfaces when the solder bumps are melted. Thus, by accurately positioning the predetermined regions using their relationship with the semiconductor integrated circuit and melting the solder bumps when the semiconductor integrated circuit and the substrate are to be bonded, the solder bumps contacting the contact surfaces are guided by the guidance structure to the predetermined regions. As a result, the semiconductor integrated circuit and the substrate can be accurately positioned.

What is claimed is:

1. A semiconductor device including a substrate bonded to a semiconductor integrated circuit, comprising:
   a plurality of sphere shaped solder bumps adhered to the semiconductor integrated circuit;
   a plurality of contact portions, each of which is disposed at a position corresponding to the position of each of the plurality of solder bumps and includes a contact surface which contacts the corresponding solder bump;
   a guidance structure disposed in the contact surface, the guidance structure includes a hole and when the solder bump is melted, guides the melted solder bump to the hole within the contact surface, the hole is set so that the semiconductor integrated circuit and the substrate are accurately aligned, and the hole is provided having a dimension small enough to form the dimension of the solder bump that guides only the melted solder therein; and
   a space regulating member to regulate a space between the semiconductor integrated circuit and the substrate, after the melted solder is guided into the guidance structure, when the semiconductor integrated circuit and the substrate are bonded together.

2. The semiconductor device of claim 1, wherein a substance having a low affinity with solder is applied, as the guidance structure, to the contact surface so as to surround the predetermined region.

3. The semiconductor device of claim 1, wherein
the semiconductor integrated circuit includes an optical communication element that conducts optical communication,
the substrate includes an optical waveguide used for the optical communication, and
the positional relationship between an end of the optical waveguide at a surface of the semiconductor integrated circuit side and the predetermined region of the contact surface corresponds to the positional relationship between the optical communication element and the solder bump.

4. A method of positioning a substrate and a semiconductor integrated circuit, comprising:
bonding a semiconductor integrated circuit that includes a plurality of sphere shaped solder bumps and a substrate that includes a plurality of contact portions disposed at positions corresponding to the plurality of solder bumps, each of the plurality of contact portions includes a contact surface which contacts the corresponding solder bump so that the solder bumps and the contact portions contact each other,
positioning the semiconductor integrated circuit with respect to the substrate by using a guidance structure disposed in the contact surface;
melting the solder bumps to cause the melted solder bumps to flow to the guidance structure, wherein the guidance structure includes a hole, wherein when the solder bump is melted, the guidance structure guides the melted solder bump to the hole within the contact surface, the hole is set so that the semiconductor integrated circuit and the substrate are accurately aligned, and the hole is provided having a dimension small enough to form the dimension of the solder bump that guides only the melted solder therein; and
regulating a space between the semiconductor integrated circuit and the substrate after the melted solder is guided into the guidance structure.

5. The positioning method of claim 4, wherein a substance having a low affinity with solder is applied, as the guidance structure, to the contact surface so as to surround the predetermined region.

6. The positioning method of claim 4, wherein
the semiconductor integrated circuit includes an optical communication element that conducts optical communication,
the substrate includes an optical waveguide used for the optical communication, and
the positional relationship between an end of the optical waveguide at a surface of the semiconductor integrated circuit side and the predetermined region of the contact surface corresponds to the positional relationship between the optical communication element and the solder bump.

7. A semiconductor device including a substrate bonded to a semiconductor integrated circuit, comprising:
a plurality of sphere shaped solder bumps adhered to the semiconductor integrated circuit;
a plurality of contact portions that is disposed at positions corresponding to the plurality of solder bumps, each of the plurality of contact portions having a contact surface which contacts the corresponding solder bump;
a plurality of guidance structures disposed in the plurality of contact surfaces where each guidance structure includes a hole, and when the solder bumps are melted, guides the melted solder to the holes within the contact surfaces, wherein the guidance structures are formed to a size having a dimension small enough to form the dimension of the solder bump that guides only the melted solder therein by a guidance structure forming device; and
a space regulating member to regulate a space between the semiconductor integrated circuit and the substrate, after the melted solder is guided into the guidance structure, when the semiconductor integrated circuit and the substrate are bonded together;
wherein the guidance structure forming device includes
a support substrate in which an opening is formed,
a photographing unit that photographs via the opening, and
a plurality of guidance structure forming portions that forms the plurality of guidance structures and is disposed in a surface of the support substrate opposite to the photographing unit side, with the positional relationship of the plurality of guidance structure forming portions with respect to a photographic center position of the photographing unit in the opening corresponding to the positional relationship of the plurality of solder bumps with respect to an optical communication element attached to the semiconductor integrated circuit.

* * * * *